US010465431B2

(12) United States Patent
Jiang

(10) Patent No.: US 10,465,431 B2
(45) Date of Patent: Nov. 5, 2019

(54) PNEUMATIC BI-PARTING DOOR SYSTEM WITHOUT A FLOOR TRACK IN THE DOORWAY FOR DATA CENTER AISLE CONTAINMENT

(71) Applicant: SCHNEIDER ELECTRIC IT CORPORATION, West Kingston, RI (US)

(72) Inventor: Yuchun Jiang, Saint Peters, MO (US)

(73) Assignee: Schneider Electric IT Corporation, West Kingston, RI (US)

(*) Notice: Subject to any disclaimer, the term of this patent is extended or adjusted under 35 U.S.C. 154(b) by 290 days.

(21) Appl. No.: 15/465,226

(22) Filed: Mar. 21, 2017

(65) Prior Publication Data
US 2018/0279498 A1 Sep. 27, 2018

(51) Int. Cl.
*E05F 17/00* (2006.01)
*E05F 15/56* (2015.01)
*H05K 7/14* (2006.01)
*E05D 15/06* (2006.01)
*E06B 7/22* (2006.01)

(52) U.S. Cl.
CPC ........ *E05F 17/004* (2013.01); *E05D 15/0656* (2013.01); *E05F 15/56* (2015.01); *E06B 7/22* (2013.01); *H05K 7/1497* (2013.01); *E05F 2017/005* (2013.01); *E05Y 2900/20* (2013.01)

(58) Field of Classification Search
CPC ... E05F 15/56; E05F 17/004; E05F 2017/005; E05F 2017/007; E05D 15/0652; E05D 15/0656; E05D 15/0626
USPC .... 52/207, 243.1; 49/118, 120, 123, 366, 36
See application file for complete search history.

(56) References Cited

U.S. PATENT DOCUMENTS

| 1,054,376 A | | 2/1913 | Weidrich | |
| 1,881,016 A | * | 10/1932 | Rose | E05F 15/60 310/13 |
| 1,881,017 A | * | 10/1932 | Jacobson | E05F 15/56 310/13 |
| 3,872,622 A | * | 3/1975 | Berk | E05F 15/60 49/118 |

(Continued)

FOREIGN PATENT DOCUMENTS

DE 202007006688 U1 * 10/2008 ............ E05F 17/004
EP 0472845 3/1992

(Continued)

OTHER PUBLICATIONS

English Language Machine Translation of description for Korean Patent Application Publication No. KR100873334, dated Dec. 10, 2008, 8 pages.

(Continued)

*Primary Examiner* — Robert Canfield
(74) *Attorney, Agent, or Firm* — Locke Lord LLP

(57) ABSTRACT

An economical bi-parting door assembly for an aisle between two rows of data center IT racks is disclosed which is easy to assemble, has no floor track or leveling requirements, and an overhead suspension and drive assembly for the left and right door assemblies. Guide ribs and channels can be provided for the door leaves at the lower portions of the leaves and mating features are placed on the leading faces of the leaves. Some features are designed to work specifically with a containment system frame for server cabinets.

13 Claims, 6 Drawing Sheets

(56) References Cited

U.S. PATENT DOCUMENTS

| | | | | |
|---|---|---|---|---|
| 4,091,570 | A | * | 5/1978 | Favrel ................ E05D 15/1044 49/118 |
| 4,290,368 | A | * | 9/1981 | Mazzini ............... B61D 19/026 105/341 |
| 4,344,206 | A | | 8/1982 | Hermanson |
| 4,457,108 | A | * | 7/1984 | Kuschel ................... B60J 5/062 49/118 |
| 4,912,878 | A | * | 4/1990 | Bentley ............... E05B 65/0882 49/15 |
| 5,139,111 | A | | 8/1992 | Baumann et al. |
| 5,148,631 | A | * | 9/1992 | Bayard ................ E05F 15/565 49/370 |
| 5,247,763 | A | | 9/1993 | Hein |
| 6,910,301 | B2 | | 6/2005 | Kalempa et al. |
| 7,219,950 | B2 | * | 5/2007 | McDonald, II .......... B60J 5/125 296/155 |
| 8,857,120 | B2 | * | 10/2014 | Marrs ................... A62C 35/00 312/201 |
| 9,560,777 | B2 | | 1/2017 | Krietzman et al. |
| 2008/0276535 | A1 | * | 11/2008 | Delgado ............ E05D 15/0652 49/120 |
| 2011/0271610 | A1 | * | 11/2011 | Cottuli ............... H05K 7/20745 52/173.1 |
| 2011/0278998 | A1 | * | 11/2011 | Caveney ............ H05K 7/20745 312/109 |
| 2011/0278999 | A1 | * | 11/2011 | Caveney ............ H05K 7/20745 312/198 |
| 2012/0181906 | A1 | * | 7/2012 | Caveney ............ H05K 7/20745 312/237 |
| 2013/0210335 | A1 | * | 8/2013 | Krietzman ........... H05K 5/0213 454/184 |
| 2013/0276389 | A1 | * | 10/2013 | Marrs .................... A62C 35/00 52/173.1 |

FOREIGN PATENT DOCUMENTS

| | | | | |
|---|---|---|---|---|
| EP | 2570011 | B1 | * | 1/2018 |
| EP | 3379907 | A1 | * | 9/2018 |
| JP | 10121847 | A | * | 5/1998 ............ E05F 17/004 |
| JP | 11166366 | A | * | 6/1999 ............... E05C 7/00 |
| JP | 2016054234 | A | | 4/2016 |
| KR | 100873334 | | | 12/2008 |
| KR | 20160136909 | | | 11/2016 |

OTHER PUBLICATIONS

English Language Machine Translation of description for Korean Patent Application Publication No. KR20160136909, dated Nov. 30, 2016, 14 pages.

Extended European Search Report for European Patent Application No. 18162256.4 dated Jul. 9, 2018, 8 pages.

* cited by examiner

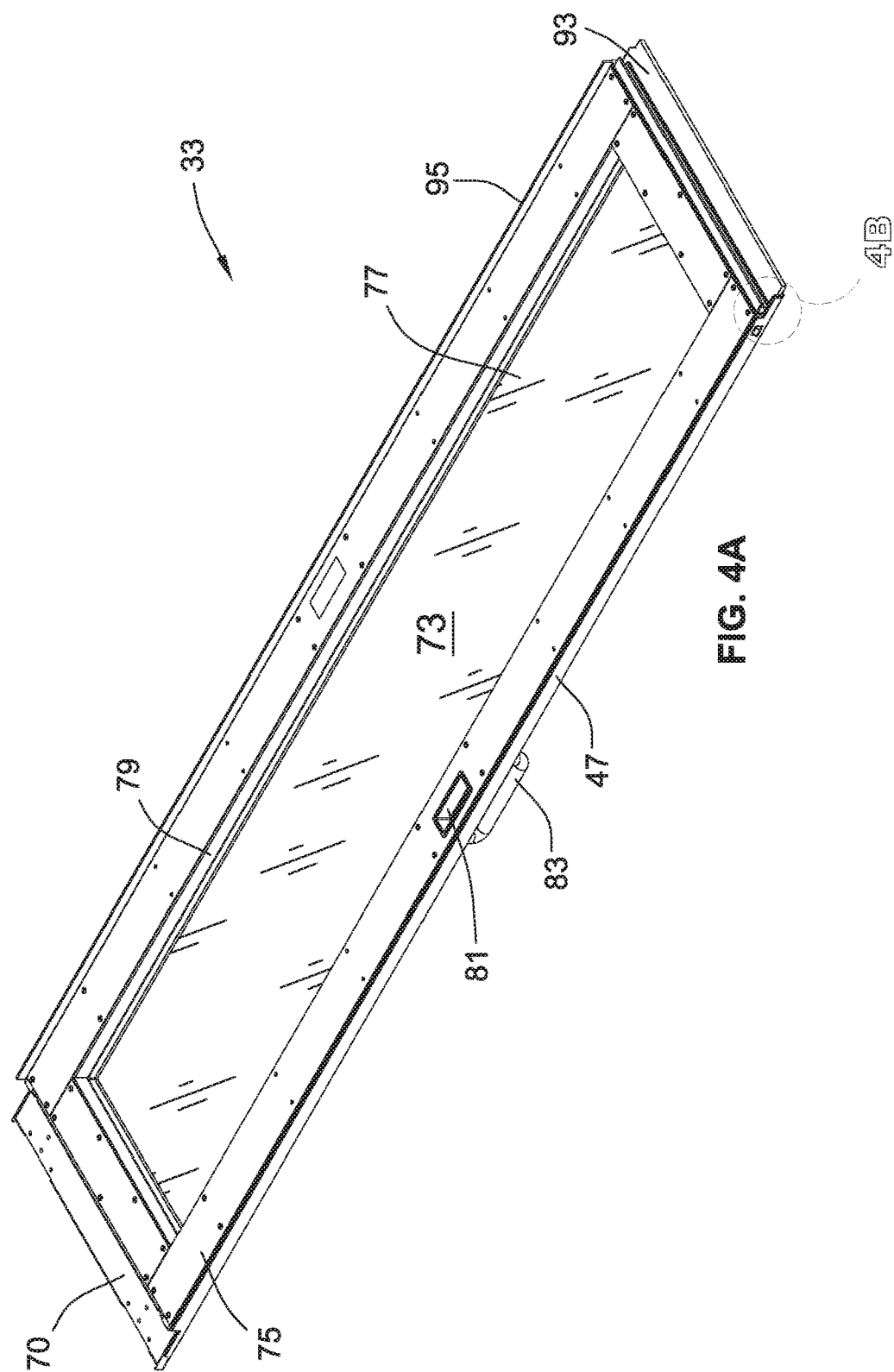

PNEUMATIC BI-PARTING DOOR SYSTEM WITHOUT A FLOOR TRACK IN THE DOORWAY FOR DATA CENTER AISLE CONTAINMENT

BACKGROUND OF THE INVENTION

1. Field of the Invention

The present disclosure relates to data center racks and cabinets, and more particularly to the doors used with, or as, surrounding structures used to contain and manage air around the equipment racks. The terms "racks" and "cabinets" will be used synonymously herein.

2. Discussion of Related Art

Containment systems are used within data centers in order to control the flow of air throughout the data center, prevent mixing of hot and cold air and to optimize the air flow through equipment racks. Containment systems will typically isolate the center aisle defined between parallel rows of equipment racks to maintain adequate cooling, conserve energy and lower cooling cost. Some exemplary containment systems are illustrated by U.S. patent application Ser. Nos. 14/927,686, 14/928,236, and 14/928,251, of common ownership herewith. Major components of a containment system will include a roof and doors which might be directly mounted to the equipment racks or mounted to a stand alone frame structure. Other containment system components may include a base frame, roof panels, access windows, cantilever arms, and beam platforms for supporting cable management accessories.

Covering the entrance to the aisle is a door to help manage the air flow of the containment system while providing access (preferably visual and physical) to the front or the back panels of the server racks. There are various containment doors on the market, including single or double swing doors, and bi-parting doors. Bi-parting doors are defined herein as a double door having two leaves, one on each side of a center vertical line of the entrance, which slide in the same plane and meet by abutment of their leading edges at a central vertical line. Bi-parting doors offer several advantages for use in data centers, including limited footprint and space requirements and the ability to easily operate manually or automatically and stay open.

One example of a bi-parting door is Schneider Electric's ECOAISLE door. The ECOAISLE door is a manually operated bi-parting door whose panels are supported and slide on a floor track and are guided by top and bottom tracks. However, bottom-supported doors, such as the ECOAISLE door, require a level doorway and parallel extended tracks that are level to operate properly.

SUMMARY OF THE INVENTION

One purpose of the bi-parting door system of the present invention is to eliminate the floor track requirement for a data center aisle containment door. Another purpose is to provide low cost door assembly alternatives with simplified installation structures and integration features for a door assembly suitable for containment systems in various types of data centers.

The weight of the door leaves is carried by the top rail assembly. Since there is no floor track in the doorway, the present invention eliminates the strict floor levelness requirement and also allows equipment to be easily rolled through a doorway if necessary. Further the door assembly can be relatively low in overall weight and comprise a low number of sub-assemblies to be economically shipped to the build site and easily assembled to a containment frame or directly to the cabinets themselves if desired.

The two door leaves are tied to a belt and pulley system to allow simultaneous movement. In some aspects of the invention each door leaf is also tied to a spring powered reel so that the door will open automatically if the air pressure or lock is released, thus providing emergency egress. Simple connector brackets are used to tie door leaves to the belt, and the air cylinder rod, and the spring powered reels. The door can be manually or pneumatically operated.

The present invention will thus provide a bi-parting door assembly with left and right door leaves for covering an aisle entrance between two rows of data center cabinets, comprising: a top rail assembly with a suspension and travel system for the door leaves, the suspension and travel system carrying all weight of the door leaves and allowing the door assembly to open and close; a left door leaf assembly being fastened to top rail assembly and further having brush seals and a guide rib and front edge alignment features attached thereto; a right door leaf assembly being fastened to top rail assembly and further having brush seals and a guide rib and front edge alignment features attached thereto; lower guide channels behind each door leaf assembly for receiving their guide ribs; and fasteners for holding the top rail assembly in a position over the aisle entrance. The top rail assembly may include a carriage frame, carriage plates, and a drive belt for simultaneous operation of both door leaves. The top rail assembly may include pneumatic drive apparatus for the drive belt. The bi-parting door assembly may include left and right side door frame panels, with the door frame panels having the lower guide channels fastened thereto. The bi-parting door assembly may be arranged wherein the door leaves overlay the frame panels, and the frame panels overlay the two rows of data center cabinets. The bi-parting door assembly may further include an independent frame affixed to and supporting the top rail assembly. The independent frame for the top rail assembly may further support the side panel frames. The top rail assembly may be attached to a frame which is a part of a containment system for the two rows of data center cabinets. At least one of the left and right door leaves may include a foam seal on the leading edge of the door leaf. The door leaf assemblies may include handles on the door leaves. The bi-parting door assembly may be arranged wherein the top rail assembly covers an entire length of door travel at all times.

BRIEF DESCRIPTION OF THE DRAWINGS

The foregoing and other advantages of the disclosed embodiments will become apparent upon reading the following detailed description and upon reference to the drawings, wherein:

FIG. 4A is a perspective view of a left door leaf assembly with the interior surface facing up.

DETAILED DESCRIPTION

As an initial matter, it will be appreciated that the development of an actual commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Further, words of degree, such as "about," "substantially," and the like may be used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

Figure 1:
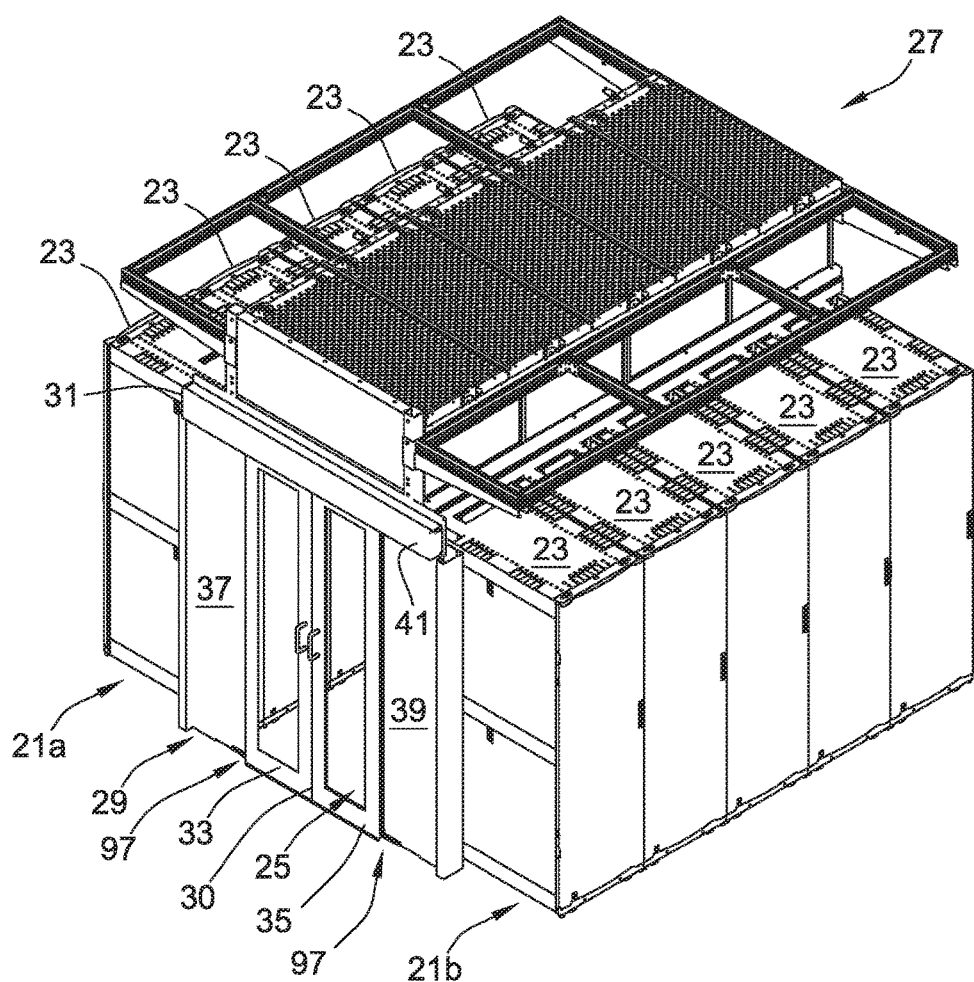
FIG. 1 is a top right perspective view of two rows of server cabinets with an aisle therebetween and a containment system mounted thereon illustrating a door assembly according to the present invention.

In FIG. 1, two rows, 21a and 21b, left and right respectively, of server cabinets, collectively 23, form an aisle 25 between them. The server cabinets 23 are shown empty and lacking front and back cabinet covers for ease of illustration. A containment system 27 for managing air flow and temperature is shown mounted on top of the aisle 25 and the cabinet rows 21a, 21b. More particularly with respect to the present invention is shown a door assembly 29 covering the entrance to the aisle 25 at its front, i.e. the foreground of the figure, which forms a significant structure of the air management functionality and may therefore be considered as a major part of the containment system 27.

The door assembly 29 includes a top rail assembly 31, a Left door leaf assembly 33, a Right door leaf assembly 35, and a left door frame panel 37 and right door frame panel 39; as further explained below. It will be noted that the door assembly 29 contains no bottom track or rail, as the top rail assembly 31 carries the entire weight of the door leaf assemblies 33, 35 suspended thereon. Attendant advantages include a lack of precision leveling and the absence of any floor-level impediments to entry into the aisle 25.

Figure 2:
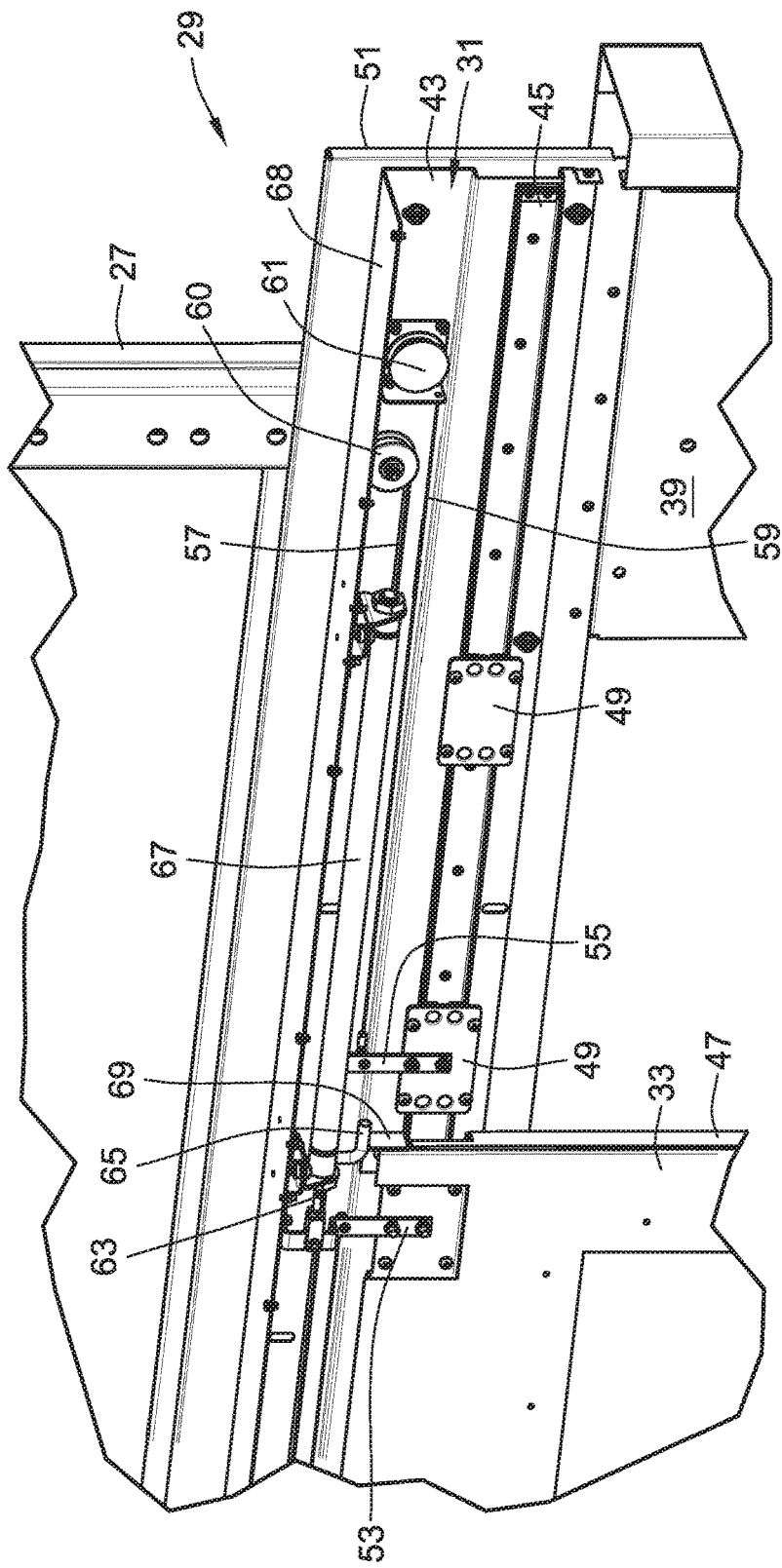
FIG. 2 is a partial view of a right front perspective of a partially constructed door assembly with an uncovered top rail assembly.

FIG. 2 shows a partial view of a right front perspective of a partially constructed door assembly 29 with an uncovered top rail assembly 31, from which is suspended only the left door leaf assembly 33, leaving the right door frame panel 39 exposed. The cover 41 of the top rail assembly 31 is visible in FIG. 1. The top rail assembly 31 may include a main back plane 43 to which is tenaciously attached a carriage track 45 being in this instance a C-channel for carriage plates, collectively 49, to slide in. Each door leaf assembly 33, 35 will be mounted to two of the carriage plates 49 for bearing substantially all the weight thereof and allowing the door leaves to travel left and right in a single plane bi-parting door arrangement whereby the door leaf assembly leading edges, e.g. ref. no. 47 for the left door leaf assembly in FIG. 2; abut when closed as best seen in FIG. 1. The main back plane 43 in the illustrated embodiment is further bolted to a support plate 51 which can be affixed to the left and right door frame panels 37, 39, respectively, or to the frame of the containment system 27, or the tops of the cabinet rows 21a, 21b as may appropriate or desired in certain instances.

Further parts of the top rail assembly 31 may include left and right connecter brackets 53, 55 respectively, for tying their respective carriage plates to a drive belt 57 and attachment of a reel cord 59 of a spring powered reel 61 pre-connected to the main back plane 43. The spring powered reel 61 may be provided, one for each door leaf assembly, to provide a bias force for aiding in opening the door and emergency egress.

The drive belt 57 is a continuous loop mounted on idler pulleys e.g. 60 at its left and right (shown) sides. During door installation the left connecter bracket 53 e.g. will be connected through brackets to left door leaf assembly 33, the drive belt 57 and a pneumatic cylinder rod 63 for a power assisted closing, and optionally opening, of the bi-parting door. A hose connection 65 for the air cylinder 67 is provided to deliver motive power. The air cylinder 67 can be connected via mounting brackets to a top projection 68 of the main back plane 43. The right connecter bracket 55 is connected to the parallel, here lower, branch of the loop of the drive belt 57 opposite that of the left bracket, and then to the right door leaf assembly 35 obviously, so the belt 57 will simultaneously move the right door leaf assembly 35 (FIG. 1) in the correct direction when mounted. Since the leaves 33, 35 are connected to the spring reels 61, the door assembly will open automatically if the air pressure or a lock is released. A middle-stop bracket 69 may be appropriately connected above the carriage track 45 to stop the door leaf assemblies 33, 35 in the middle of the door 29.

Figure 3:
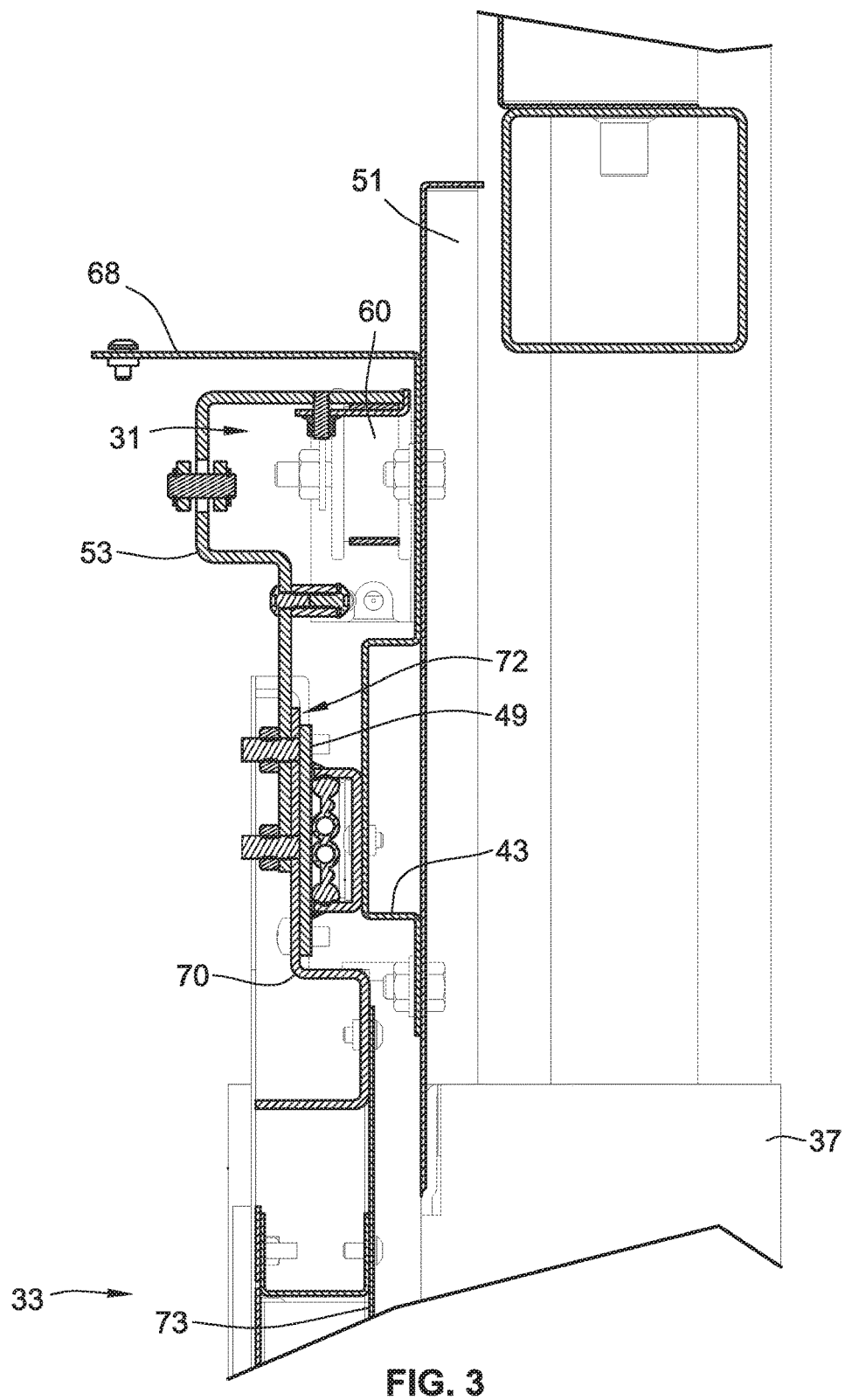
FIG. 3 is a detail in cross section of a door suspension assembly.

FIG. 3 is a detail in cross section of a door suspension assembly, here of the left door leaf assembly 33. Here it will be noted that the door leaf assembly, connector bracket, and carriage plate parts are arranged to let the door leaves hang freely vertical. For example, the top horizontal panel 70 of the left door leaf assembly 33 provides a recessed mounting surface 72, such that joining of the top horizontal panel 70 to the carriage plate 49 creates a mounting plane in the center of the left door leaf assembly 33. This will optimize the center of gravity of the door to allow the door to hang freely vertical from the top rail assembly 31, thus avoiding any offset between the door leaf assemblies and any torqueing of the drive belt 57. The right door leaf assembly 35 connections to the top rail assembly 31 will be similarly arranged to freely vertically suspend the mass of the door leaf. The left and/or right connector brackets 53, 55 are attached to the front of the two central carriage plates and are angled as necessary to preserve the free vertical hanging and no belt torqueing aspects of the door assembly 29.

Figure 4B:
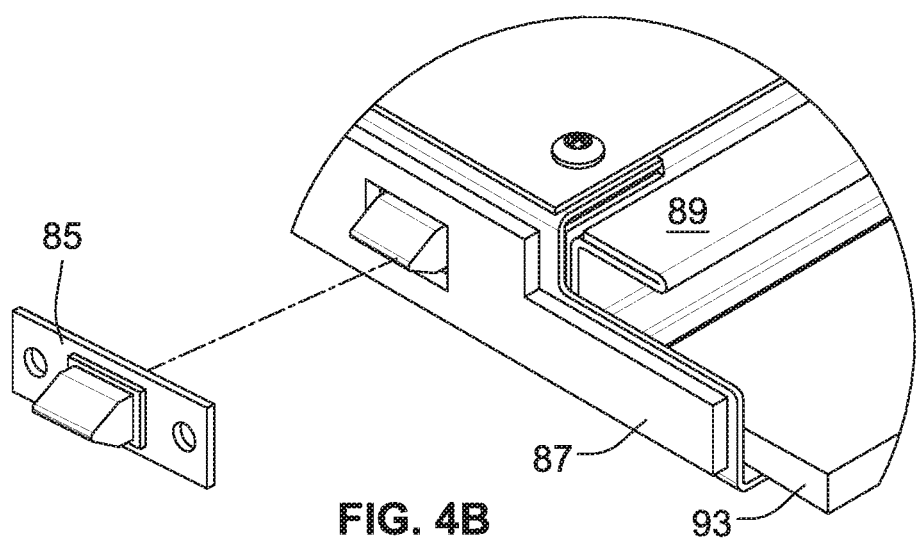
FIG. 4B is a detail perspective view of the bottom corner of FIG. 4A.
Figure 4C:
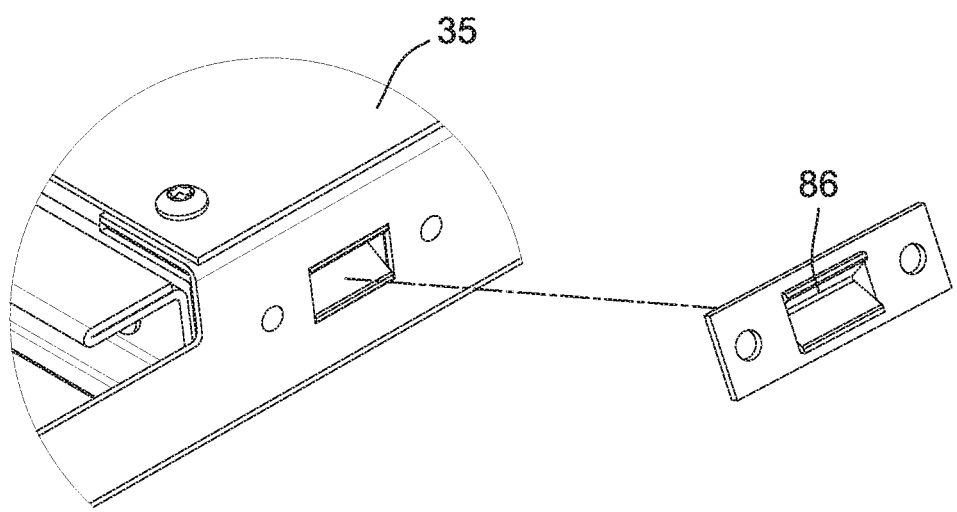
FIG. 4C is a detail perspective view of the complementary bottom corner of the right door leaf assembly for abutting the corner of FIG. 4B.

FIGS. 4A and 4B provide a perspective view of an exemplary door leaf assembly, here the left door leaf assembly 33, with the interior, or back, surface 73 facing up. The door leaf assembly 33 may include a top horizontal panel 70, a door back cover 75; a central glass panel 77; glass mounting brackets 79; an inside handle 81; an outside handle 83; and a V-shaped alignment wedge 85 (FIG. 4B) on the leading edge 47 of the left door leaf assembly 33 only. The complementary alignment V-groove serving as a receptacle 86 (FIG. 4C) for docking the alignment wedge 85 is placed appropriately on the leading edge of the complementary (right) door leaf assembly 35 (FIG. 4C). Other components include a leading edge foam seal 87, for left door only; a combination Guide rib 89 and bottom brush holder 91; and air seal brushes including a bottom brush 93 and a back edge vertical brush 95.

Figure 5:
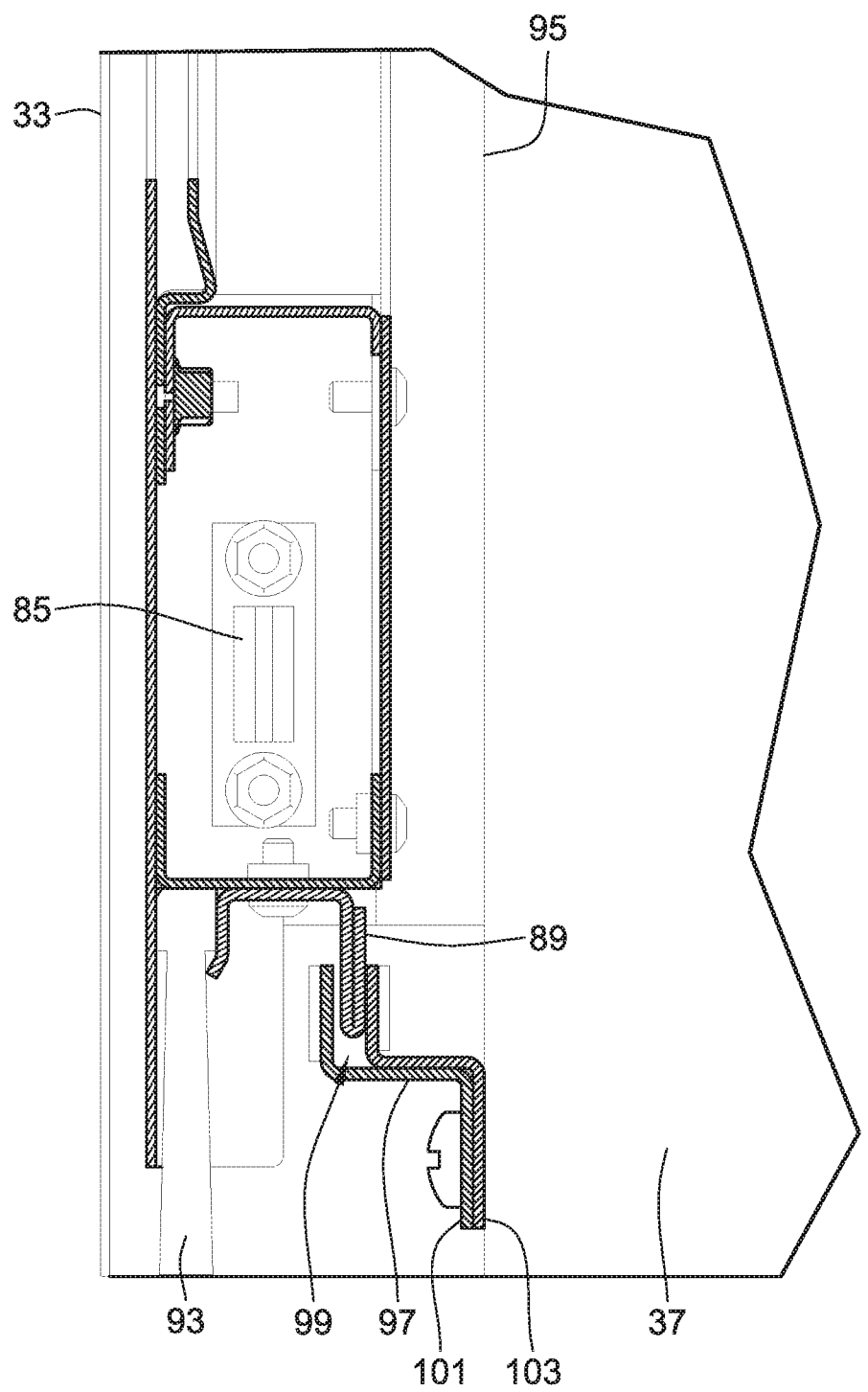
FIG. 5 is a detail in cross section of a left door leaf assembly bottom in place within the left door frame guide.

FIG. 5 is a detail in cross section of a bottom section of the left door leaf assembly 33 in place within the short guide 97 of the left door frame panel 37. Each of the left and right door frame panels 37, 39 respectively, will have a guide 97 which provides an unobtrusive section of channel 99, preferably much shorter than the length of the guide rib 89, mounted to the lower face of door frame panel 37 for receiving the guide rib 89 of the complementary door leaf assembly, e.g. 33, to stabilize movement and help position the door assemblies. The channel 99 may be formed by two shaped brackets 101, 103 fastened together and screwed or otherwise fastened to the door frame panel 37 as shown in FIG. 5, or extruded as a single piece and fastened down as desired.

For steps to install the door assembly 29: with the top rail cover 41 removed, use a bolt and nut to install the top rail assembly 31 to the frame of the containment system 27, screw door assemblies 33, 35 to the carriage plates 49, and screw mount the short guides 97, to the lower front of the door frame panels 37, 39. While keeping each door leaf assembly fully open use a hex nut to tie the connector brackets 53, 55 to the left and right door leaf assemblies. Door frame panels 37, 39 may be mounted to the support plate 51, the frame of the containment system 27, or directly to the faces of the cabinets 23. In some aspects of the invention the door frame panels 37, 39 may not be absolutely required. In such aspects, if the top rail assembly 31 is otherwise adequately supported, one might just use adequately sized brush seals bearing against the front cabinets and fasten the short guide channels to the cabinet faces forming the aisle entrance. Use bolts and nuts to tie the left and right connector brackets 53, 55 to the drive belt 57, and use a Clevis pin to tie the left connector bracket 53 to the cylinder rod 63. Connect the spring reel cables to the connector brackets if they are present and not pre-connected. With all connections made install the top rail cover 41. It will be appreciated that the door assembly 29 can mounted on structures other than the containment frame described in this document such as directly to the equipment cabinets 23, for example. Alternative embodiments may consider having the door frame panels and top rail assembly mounted on an independent frame furnished separately from the containment frame.

For door operations: to pneumatically close the door and hold it close, a push button (not shown) can be provided to activate the air cylinder 67 so the cylinder will push the door assemblies toward each other. To open the door, a push button can bleed air from the cylinder and the spring powered reels 61 will pull the door assemblies open. The air cylinder 67 can be made double acting so it can be used to open and close the door. In this case the spring powered reels 61 may be removed. In an alternative embodiment, the door could be driven electrically, e.g. with a gear type pulley driven by an electric motor to move a toothed drive belt. Push buttons can be provided on the interior and exterior of the door assembly. For safety consideration, the air cylinder will automatically bleed and the door will open if power is cut.

If a manual version of the door is desired the top rail assembly could be simplified with the only necessary components being the carriage track and carriage plates. Alternatively, the belt and pulley might be kept so the door could be open or closed with one hand.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the invention as defined in the appended claims.

The invention claimed is:

1. A bi-parting door assembly with left and right door leaves for covering an aisle entrance between two rows of data center cabinets, comprising:
   a) a top rail assembly with a suspension and travel system for the door leaves, the suspension and travel system carrying all weight of the door leaves and allowing the door assembly to open and close;
   b) a left door leaf assembly being fastened to the top rail assembly and further having brush seals and a guide rib and a front edge alignment feature attached thereto, wherein the front edge alignment feature is attached to a lower leading edge of the left door leaf assembly;
   c) a right door leaf assembly being fastened to the top rail assembly and further having brush seals and a guide rib and a front edge alignment feature attached thereto, wherein the front edge alignment feature is attached to a lower leading edge of the right door leaf assembly;
   d) lower guide channels behind each door leaf assembly for receiving their guide ribs; and
   e) fasteners for holding the top rail assembly in a position over the aisle entrance, wherein the top rail assembly further comprises,
   f) a biasing member for each door leaf assembly configured to provide a biasing force to assist in opening the bi-parting door assembly; and
   g) a pneumatic drive apparatus configured to provide a power assisted closing of the bi-parting door assembly, and
   wherein the biasing force provided by the biasing member is configured to automatically open the bi-parting door assembly upon air pressure being released from the pneumatic drive apparatus.

2. The bi-parting door assembly of claim 1 wherein the top rail assembly includes a carriage track, carriage plates, and a drive belt for simultaneous operation of both door leaves.

3. The bi-parting door assembly of claim 2 wherein the pneumatic drive apparatus is for the drive belt.

4. The bi-parting door assembly of claim 1 further including left and right side door frame panels, the door frame panels having the lower guide channels fastened thereto.

5. The bi-parting door assembly of claim 4 wherein the door leaves overlay the frame panels, and the frame panels overlay the two rows of data center cabinets.

6. The bi-parting door assembly of claim 1 further including an independent frame affixed to and supporting the top rail assembly.

7. The bi-parting door assembly of claim 6 wherein the independent frame for the top rail assembly further supports left and right side door frame panels.

8. The bi-parting door assembly of claim 1 wherein the top rail assembly is attached to a frame which is a part of a containment system for the two rows of data center cabinets.

9. The bi-parting door assembly of claim 1 wherein one of the left and right door leaves includes a foam seal on the leading edge of the door leaf.

10. The bi-parting door assembly of claim 1 wherein the door leaf assemblies include handles on the door leaves.

11. The bi-parting door assembly of claim 1 wherein the top rail assembly covers an entire length of door travel at all times.

12. The bi-parting door assembly of claim 1, wherein the biasing member for each door leaf assembly comprises a spring powered reel.

13. The bi-parting door assembly of claim 1, wherein the front edge alignment features comprise a V-shaped alignment wedge and a complimentary V-groove that serves as a receptacle of the wedge.

* * * * *